United States Patent [19]
Kim et al.

[11] Patent Number: 5,986,318
[45] Date of Patent: Nov. 16, 1999

[54] (GE,SI) NX ANTI-REFLECTIVE COMPOSITIONS AND INTEGRATED CIRCUIT DEVICES COMPRISING THE SAME

[75] Inventors: Yong-beom Kim; Dong-wan Kim, both of Seoul, Rep. of Korea

[73] Assignee: Samsung Electronics Co., Ltd., Rep. of Korea

[21] Appl. No.: 08/956,776

[22] Filed: Oct. 23, 1997

[30] Foreign Application Priority Data

Oct. 24, 1996 [KR] Rep. of Korea .................. 96-48139

[51] Int. Cl.⁶ .................................................. H01L 31/0232
[52] U.S. Cl. ........................... 257/437; 257/616; 257/741
[58] Field of Search ........................... 257/437, 616, 257/649, 797, 741; 438/761, 952, 950, 763

[56] References Cited

U.S. PATENT DOCUMENTS

| | | | |
|---|---|---|---|
| 4,870,322 | 9/1989 | Matsudaira et al. | 313/506 |
| 5,378,659 | 1/1995 | Roman et al. | 437/229 |
| 5,733,712 | 3/1998 | Tanaka et al. | 430/314 |
| 5,741,626 | 4/1998 | Jain et al. | 430/314 |
| 5,750,442 | 5/1998 | Juengling | 438/761 |
| 5,820,926 | 10/1998 | Lien | 427/162 |
| 5,841,179 | 11/1998 | Pramanick et al. | 257/437 |

*Primary Examiner*—Minh Loan Tran
*Attorney, Agent, or Firm*—Myers Bigel Sibley & Sajovec

[57] ABSTRACT

An anti-reflective composition used in manufacturing integrated circuit devices comprises a silicon-added germanium nitride material. The composition is present in a solid solution.

17 Claims, 7 Drawing Sheets

(GE,SI) NX ANTI-REFLECTIVE COMPOSITIONS AND INTEGRATED CIRCUIT DEVICES COMPRISING THE SAME

FIELD OF THE INVENTION

The invention relates to anti-reflective compositions. More specifically, the invention relates to anti-reflective compositions which are used with integrated circuit devices.

BACKGROUND OF THE INVENTION

In forming devices on integrated circuit substrates (e.g., semiconductor substrates), the substrates are typically etched using photoresist patterns as masks for ion implantation. During these processes, various problems may result when radiation light reflected from underlayers in the substrates becomes incident in photoresist films.

The incident light can generate multiple interferences inside the photoresist films and form ripples in the photoresist patterns. The ripples are typically undesirable in that they may make it difficult to precisely control line widths. Additionally, even though the ripples may be removed by post-exposure bake (PEB), "tails" or "undercuts" are often generated. Moreover, it may be difficult to control the line widths within a desired scope due to the presence of "swing effects". In particular, "swing effects" typically occur when quantities of light which may be absorbed in the photoresists periodically change according to the thicknesses of the photoresists. These periodic changes may occur even though similar exposure energies are used with the photoresists. The "swing effects" are typically attributable to the multiple interference phenomena.

Disadvantageously, notching or bridging may occur in the photoresist patterns as a possible result of the reflected light which may be generated in step difference portions of the underlayers in the integrated circuit devices. This problem may become more severe for highly integrated devices, since the devices often have varying topographies.

FIGS. 1 and 2 illustrate conventional methods for forming patterns of integrated circuit devices. As shown, layer 3 which may insulate a lower structure including, for example, a transistor, is formed on an integrated circuit (e.g., semiconductor) substrate 1, along with a material layer 5 which is used to form a pattern. A photoresist film 7 is formed on the material layer 5. As depicted in FIG. 2, a photoresist pattern is subsequently formed by exposing the photoresist film 7, typically by employing photomask 9, and then developing the film.

As shown in FIG. 1, a step difference is formed on the surface of the insulating layer 3. The step difference may be attributable to the lower structure which may cause the thickness of the photoresist film 7 to be non-uniform over the surface of the material layer 5. Moreover, subsequent to the exposing and developing steps, the line width of the photoresist pattern in a portion which has a low step difference may be different from the line width in a portion which has a high step difference. This may be attributable to the multiple interference effect. As a result, notching or bridging often occurs. The above problems may become more serious in the event that a highly reflective material such as aluminum is used in the layer which forms the pattern.

In view of the above, it has been proposed to employ an anti-reflective layer between the photoresist and the material layer to potentially minimize light impacting the photoresist film. Conventional anti-reflective layers typically include organic and inorganic layers. A conventional organic anti-reflective layer is typically formed by coating an organic material using a spin coating method. The inorganic anti-reflective layer is usually formed by coating a material such as TiNx, SiNx, and the like by employing a sputtering method, a CVD method, or a PECVD method.

Both types of layers may potentially address problems attributable to light reflected on the photoresist. In addition, the layers may have other advantages and disadvantages. The organic anti-reflective layer, for example, may be advantageous in that remaining anti-reflective layer and photoresist materials can be readily removed using a photoresist ashing process employing $O_2$ plasma. This removal typically occurs after an etching or ion implantation process which uses a photoresist pattern as a mask. Nonetheless, the organic anti-reflective layer is potentially disadvantageous in that it is typically difficult to obtain a uniform anti-reflective layer in the step portion presumably since a spin coating method is employed. Moreover, etching the organic anti-reflective layer may damage the photoresist pattern because the etching selectivity between the photoresist and the organic anti-reflective layer may not be favorable. Utilizing an inorganic anti-reflective layer may not be desirable since the remaining anti-reflective layer is often difficult to remove.

Anti-reflective layers formed from germanium and nitrogen has been proposed in an attempt to address the above problems. This anti-reflective layers may possess desirable optical properties. These layers, however, may be soluble in water. Aqueous-based solutions are employed in conjunction with manufacturing, developing, and cleaning processes involving integrated circuit devices. In many conventional processes, tetra methyl ammonium hydroxide (TMAH) is used as a developing solution, an aqueous alkaline solution is used in manufacturing, and water is used as a cleaning solution. As a result, the anti-reflective layers may be dissolved during processes which use these solutions. A photoresist lifting phenomenon can occur when the germanium and nitrogen material is removed after being dissolved in water. The photoresist pattern thus may drift from the lower film, which is potentially undesirable.

There remains a need in the art to address the problems associated with conventional anti-reflective layers.

SUMMARY OF THE INVENTION

In one aspect, the invention relates to anti-reflective compositions used in manufacturing integrated circuit devices. The compositions are present in solid solutions and comprise silicon-added germanium nitride materials.

In a second aspect, the invention relates to anti-reflective layers used in manufacturing integrated circuit devices. The anti-reflective layers are formed from compositions which are present as solid solutions. The compositions comprise silicon-added germanium nitride materials.

In a third aspect, the invention relates to method for forming integrated circuit device patterns. The methods comprise forming first material layers over underlying structures present in integrated circuit devices, forming second material layers on the first material layers, and forming anti-reflective layers described herein on the second material layers. Photoresist films are then formed on the anti-reflective layers, and the photoresist films are exposed to form photoresist patterns. The anti-reflective layer are next etched to form anti-reflective layer patterns and the second material layer are etched to form second material layer patterns. The photoresist patterns are removed and the anti-reflective layer patterns are removed.

The invention may be desirable for many reasons. The anti-reflective layers may be removed without potentially disrupting etching selectivities with respect to other layers which are present in the integrated circuit devices. Moreover, it is also possible to obtain anti-reflective layers having more uniform thicknesses in the step difference portions in comparison to conventional anti-reflective layers formed from sputtering methods.

DETAILED DESCRIPTION OF THE PREFERRED EMBODIMENTS

Figure 1:
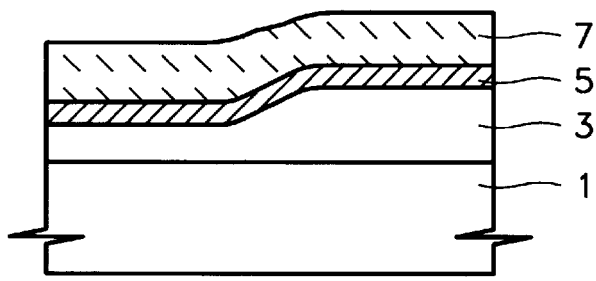
FIGS. 1 and 2 are cross-sectional views for describing a method for forming a conventional integrated circuit device pattern.
Figure 2:
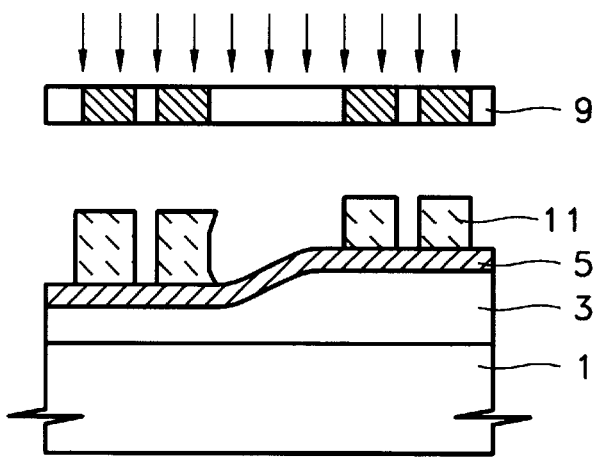

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to being "on" another layer or substrate, it can be directly on the other layer or substrate, or intervening layers may also be present.

In a first aspect, the invention relates to anti-reflective compositions used in manufacturing integrated circuit devices such as, for example, semiconductor substrate devices. Types of semiconductor substrates include, but are not limited to, single crystal silicon substrates, semiconductor on insulator (SOI) substrates, silicon on sapphire (SOS) substrates, and gallium arsenide substrates. Encompassed within the scope of the invention are a number of devices such as, for example, discrete devices and solar cells.

The anti-reflective compositions are present as solid solutions comprising silicon-added germanium nitride materials. The materials may be represented by the formula:

wherein x is a stoichiometric coefficient which varies according to the composition of the mixture of germanium and silicon. More preferably, the material may be represented by the formula:

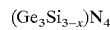

wherein x is preferably an integer ranging from 0 to 3.

The anti-reflective compositions may contain other elements in addition to germanium, nitrogen, and silicon. As an example, the anti-reflective compositions may contain elements selected from the group consisting of oxygen, tin, lead, carbon, fluorine, and mixtures thereof. The anti-reflective compositions also may contain various amounts of the elements present therein. In one embodiment, the compositions may comprise 0.8 atomic percent of silicon. In a second embodiment, the atomic ratios of germanium to silicon may range from about 0.01 to about 100. In a third embodiment, the compositions comprise 24.3 atomic percent of germanium, 6.5 atomic percent of nitrogen, 53.6 atomic percent of oxygen, 14.8 atomic percent of carbon, and 0.8 atomic percent of silicon.

In a second aspect, the invention relates to anti-reflective layers used in manufacturing integrated circuit devices. The anti-reflective layers are formed from the anti-reflective compositions described herein. In one embodiment, the anti-reflective layers may have thicknesses of at least about 5 nm. In a second embodiment, the anti-reflective layers have refractive indices of at least about 1.5. In a third embodiment, the anti-reflective layers have extinction coefficients of at least about 0.05 when exposure wavelengths are less than about 450 nm.

In a third aspect, the invention relates to methods for forming integrated circuit device patterns. The methods comprise forming first material layers over lower structures present in integrated circuit devices, forming second material layers on the first material layers, and forming anti-reflective layers described herein on the second material layers. Photoresist films are then formed on the anti-reflective layers, and the photoresist films are exposed to form photoresist patterns. The anti-reflective layers are next etched to form anti-reflective layer patterns and the second material layer are etched to form second material layer patterns. The photoresist patterns are removed and the anti-reflective layer patterns are removed.

The methods of the invention may also include additional steps. Specifically, the methods may include forming third material layers on the second material layers. The third material layers are then etched to form third material layer patterns, with the steps of etching the third material layers being carried out prior to the steps of etching the second material layers and subsequent to the steps of etching the anti-reflective layers. The third material layer patterns are next removed. These removal steps are carried out subsequent to the steps of removing the anti-reflective layer patterns. The third material layers may be formed from components known in the art including, but not limited to, doped silicon oxide, undoped silicon oxide, oxinitride, silicon nitride, and mixtures thereof. The components may be formed by processes which are known in the art.

Figure 3:
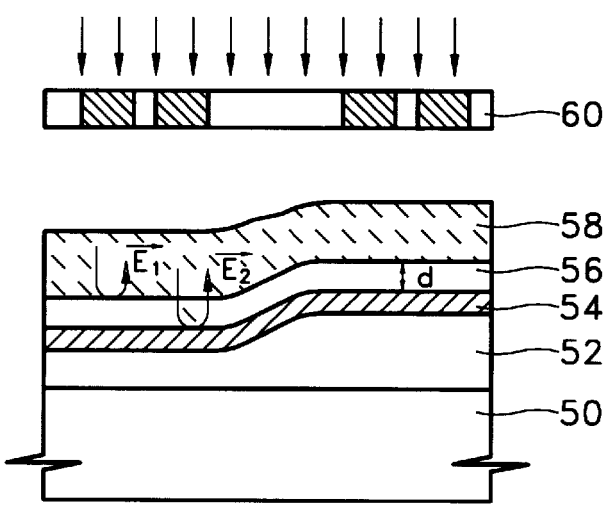
FIG. 3 is a cross-sectional view for describing an anti-reflective layer according to the present invention.

Embodiments of the invention will now be described in greater detail with reference to the drawings. Referring to FIG. 3, a first material layer is formed for covering a lower structure (not shown) which includes, for example, a transistor on an integrated circuit substrate 50 such as, for example, a semiconductor substrate. A second material layer 54 is then formed on the first material layer 52. An anti-reflective layer 56, which is present as a solid solution and includes a germanium-silicon-nitrogen alloy, is formed on the second material layer 54. The anti-reflective layer is formed by using a deposition technique known in the art such as, for example, a sputtering method or a chemical vapor deposition method. The anti-reflective layer 56 is intended to prevent light which may be incident on the second material layer 54 from being reflected. A photoresist film 58 is then formed on the anti-reflective layer 56. The photoresist film 58 is then exposed, typically by using a photomask 60, to form a photoresist pattern which is used as a mask during the second material layer 54 pattern formation.

As shown in FIG. 3, the light which is reflected from the second material layer 54 to the photoresist film 58 may be represented as the sum of: (1) the light E1 reflected from the boundary between the photoresist film 58 and the anti-reflective layer 56 and (2) the light E2 reflected from the boundary between the anti-reflective layer 56 and the second material layer 54. Although Applicants do not wish to be bound by any one theory, a possible technique to reduce the light reflected from the second material layer 54 to the photoresist film 58 is to create a phase difference of 180° between the light E1 and the light E2. As a result, a destructive interference of the incident light typically occurs. In this instance, the anti-reflective layer 56 functions as a interference type anti-reflective layer. Alternatively, light can be absorbed when passing through anti-reflective layer 56 so that a minimal amount of light E2 may be reflected to photoresist film 58. In this instance, the anti-reflective layer 56 functions as a absorbent type anti-reflective layer.

Typically, when the anti-reflective layer 56 serves as an interference type anti-reflective layer, the layer should preferably have a thickness close to the odd values of $\lambda/4n$, wherein $\lambda$ denotes an exposure wavelength and "n" denotes the refractive index of the anti-reflective layer determined at the exposure wavelength. The optimal thickness of the interference type anti-reflective film may be determined by measuring a reflection factor which typically takes into account the refractive index of: (1) the anti-reflective layer at the exposure wavelength and (2) films present over and under the anti-reflective layer. The absorbent type anti-reflective layer should be of sufficient thickness so that incident light may be absorbed when passed therethrough.

The silicon-added germanium nitride material contained in anti-reflective layer 56 of the present invention is typically formed by employing a sputtering technique or chemical vapor deposition technique. Accordingly, the anti-reflective layer 56 may be of uniform thickness in a step difference portion with the thickness being potentially easy to control.

Figure 4:
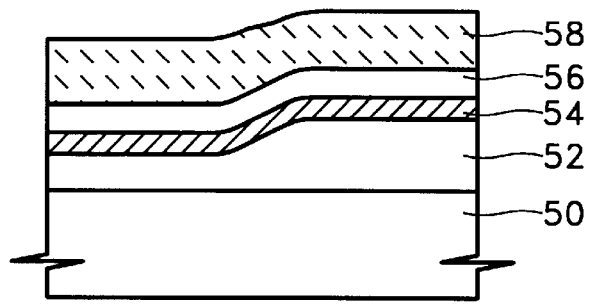
FIGS. 4 to 9 are sectional views for describing a method for forming a pattern according to the invention.

FIG. 4 illustrates the steps involved in forming photoresist film 58. In this embodiment, a lower structure (not shown), which may include, for example, a transistor, is formed on an integrated circuit device substrate 50 (e.g., a semiconductor substrate). A first material layer 52 is formed on the lower structure. The first material layer 52 may be in the form of, for example, an insulating layer. A second material layer 54 is then formed on the first material layer 52, usually by depositing material on the first material layer 52 and patterning the second material layer. Subsequently, an anti-reflective layer 56 comprising a silicon-added germanium nitride material is formed in order to minimize incident light from being reflected to the second material layer 54. A photoresist film is subsequently formed by depositing a photoresist-forming material on the anti-reflective layer 56.

In the event that the first material layer 52 is used as an insulating layer, the insulating layer may contain transparent or semi-transparent material. Exemplary components which are contained in the transparent or semi-transparent material include, but are not limited to, undoped silicon oxide, doped silicon oxide, oxinitride, silicon nitride, as well as mixtures thereof. The silicon oxide may be obtained from processes known in the art. For example, the silicon oxide may be grown through thermal oxidation.

The second material layer 54 is typically a highly reflective layer and may comprise a number of components known to the skilled artisan. For example, the second material layer 54 may comprise tungsten, tungsten silicide, titanium silicide, cobalt silicide, polysilicon, aluminum, aluminum alloy, and metal silicide deposited on a polysilicon layer. Mixtures of the above may also be used. The second material layer 54 is typically formed using a known technique such as, for example, a sputtering technique, a chemical vapor deposition (CVD) technique, or a plasma-enhanced CVD (PECVD) technique.

The anti-reflective layer 56 of the present invention may be formed according to various techniques such as, but not limited to, a CVD technique, a PECVD technique, a sol-gel technique, a laser ablation technique, as well as a radio frequency (RF) sputtering technique which uses a multi-target or a germanium-silicon target. The RF sputtering techniques may be performed in an atmosphere comprising nitride gas, or an atmosphere comprising a mixture of nitride gas and argon gas. Preferably, the ratio of the argon gas to the nitride gas ranges from about 0.5 to about 2.5. In the event that a CVD technique is employed, it is preferred that the anti-reflective layer be deposited in a nitrogen and argon gas atmosphere using $SIH_4$ and $GeH_4$ as source gases. As a result, a more uniform thickness may be obtained in the step difference portion in comparison to an organic anti-reflective layer which is typically obtained by a spin coating technique.

Table 1 illustrates the deposition of an anti-reflective layer of the invention by using a sputtering technique.

TABLE 1

| Sample | power (w)/ deposition time | Ar (sccm) | $N_2$ (sccm) | Pressure (mtorr) | Thickness (A) |
|---|---|---|---|---|---|
| YGSN0001 | 250/10 minute | 60 | 30 | 16.5 | 2000 |
| YGSN0002 | 250/10 minute | 60 | 40 | 32.1 | 1160 |
| YGSN0003 | 250/10 minute | 60 | 45 | 43.1 | 5260 |
| YGSN0004 | 250/10 minute | 45 | 45 | 21.3 | 1260 |
| YGSN0005 | 350/10 minute | 40 | 45 | 15.9 | 2400 |
| YGSN0006 | 350/10 minute | 60 | 30 | 31.8 | 3000 |
| YGSN0007 | 350/10 minute | 60 | 40 | 42.5 | 2000 |
| YGSN0008 | 350/10 minute | 60 | 45 | 21 | 1570 |
| YGSN0009 | 350/10 minute | 45 | 45 | 16.3 | 2310 |
| YGSN00010 | 250/10 minute | 40 | 45 | 16.5 | 3600 |

Although not intending to be bound by any theory, it is believed that the extinction coefficient k of the anti-reflective layer 56 varies according to the content of germanium and silicon in layer 56 at any single exposure wavelength value. Accordingly, the extinction coefficient of anti-reflective layer 56 may be controlled by selecting suitable power and flux values of the nitride gas as presented in Table 1.

If desired, physical properties of the anti-reflective layer 56 can be improved by performing various operations on the anti-reflective layer. For example, an annealing thermal treatment can be carried out on the anti-reflective layer 56 to potentially improve its overall quality. Additionally, the surface state of the anti-reflective layer 56 may be enhanced by a radio frequency (RF) plasma treatment.

Figure 5:
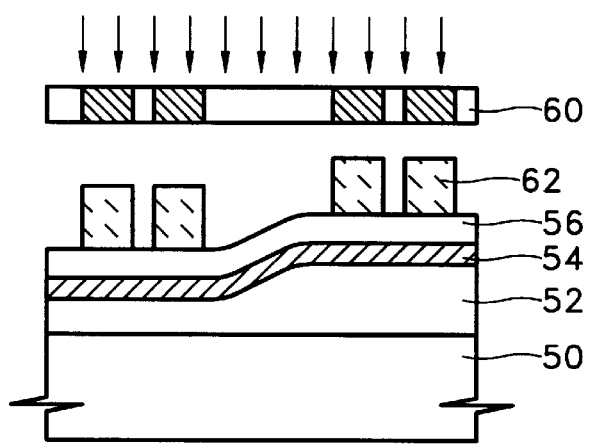

Referring to FIG. 5, the formation of a photoresist pattern is illustrated. In particular, the photoresist pattern 62 may be formed on the anti-reflective layer 56 by exposing and developing the photoresist film 58 using, for example, a photomask 60. A type of photoresist which can be used to form photoresist pattern 62 is a positive photoresist. In this embodiment, the anti-reflective layer 56 of the invention has only a slight solubility in water.

Figure 6:
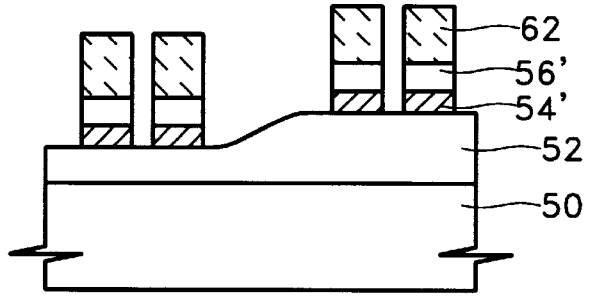

FIG. 6 shows the steps of forming an anti-reflective layer pattern 56' and a second material layer pattern 54'. In this embodiment, the anti reflective layer pattern 56' and the second material layer pattern 54' are sequentially formed by etching the anti-reflective layer 56 and the second material layer 54 using photoresist pattern 62 as an etching mask. It is believed that since there may be a favorable etching selectivity between the anti-reflective layer 56 and the photoresist pattern 62, it may be possible to minimize damage to the photoresist pattern 62.

Figure 7:
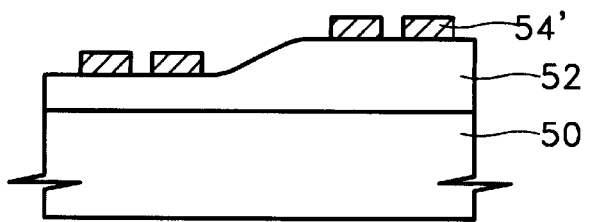

FIG. 7 illustrates the steps of removing the photoresist pattern 62 and the anti-reflective layer pattern 56'. The photoresist pattern may be removed using a suitable technique such as a photoresist ashing process. A photoresist ashing process typically employs oxygen plasma. The anti-reflective layer pattern 56' may be removed using a solution which comprises a mixture of sulfuric acid and hydrogen peroxide.

Figure 8:
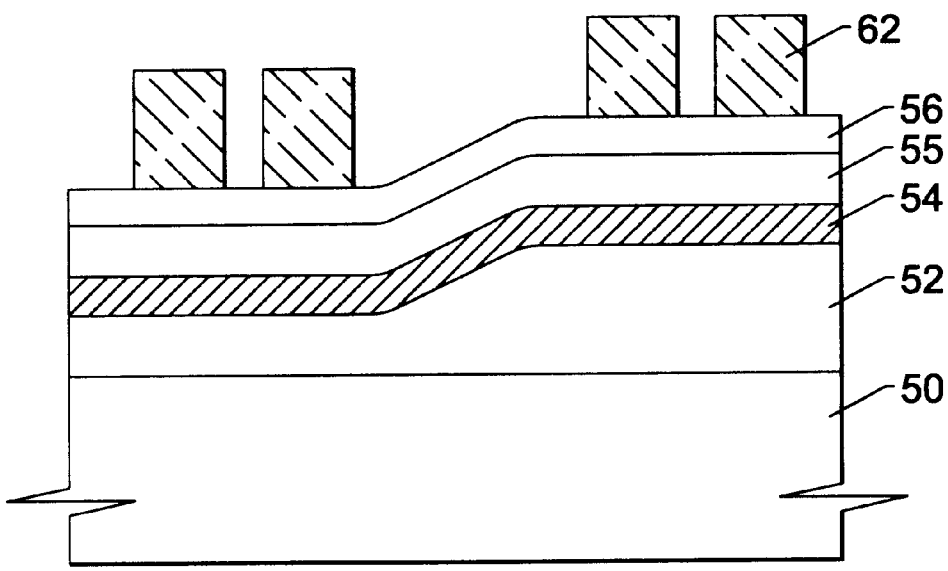
Figure 9:
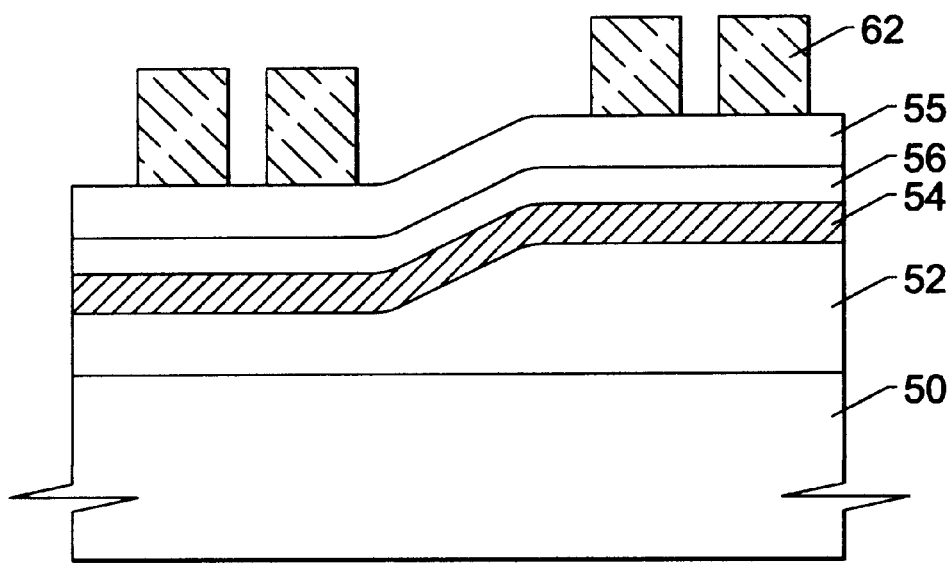

Referring to FIG. 8, a material layer 55 may be formed which can be transparent or semitransparent with respect to the exposure wavelength on the second material layer 54. In another embodiment illustrated in FIG. 9, a material layer 55 may be formed which is transparent or semitransparent with respect to the exposure wavelength between the photoresist film 58 and the anti-reflective layer 56. The material layer 55 which is transparent or semitransparent with respect to the exposure wavelength may comprise, for example, undoped silicon oxide, doped silicon oxide, oxinitride, and silicon nitride. Mixtures of any of the above components may also be used. The components may be formed by processes which are known in the art. For example, the silicon oxide may be grown through thermal oxidation. In FIGS. 8 and 9, anti-reflective layers may be formed on second material layers to form patterns as described herein.

Figure 10:
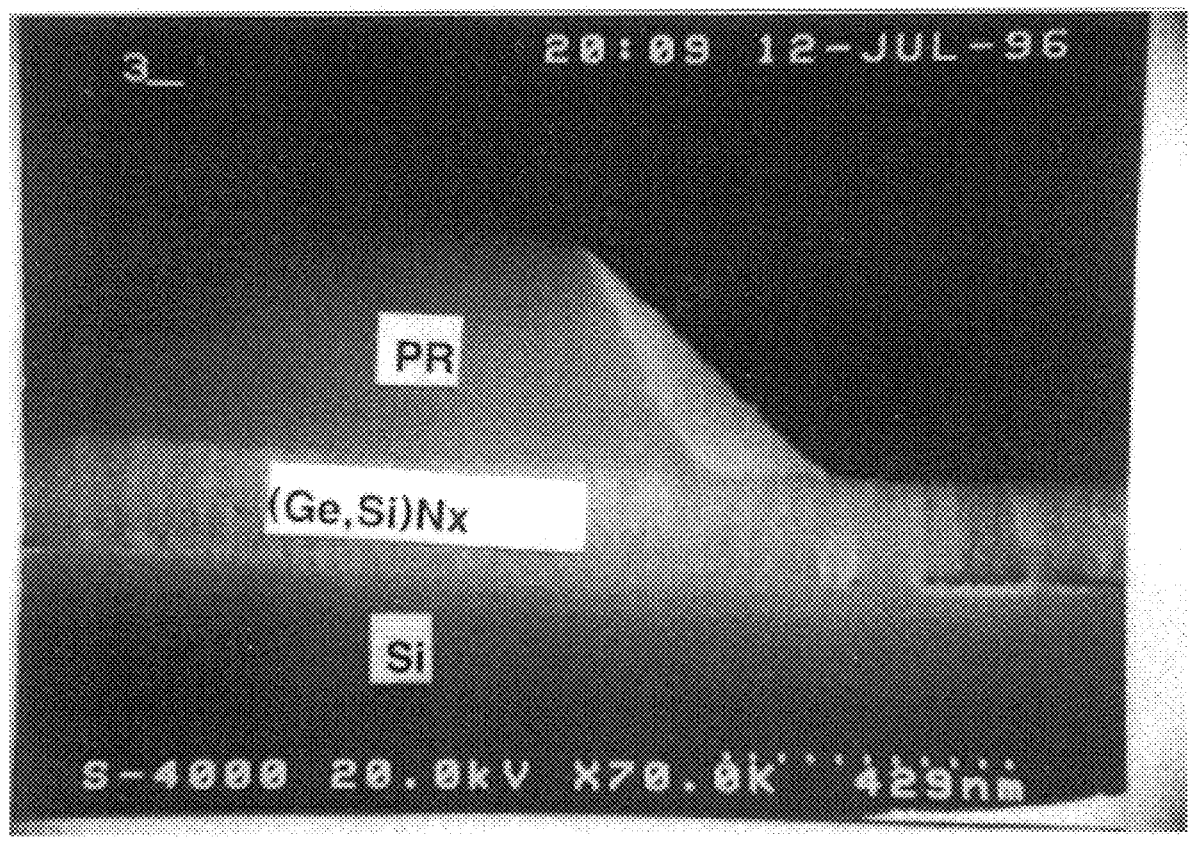
FIG. 10 is an SEM photograph showing a section of an anti-reflective layer of the invention subsequent to a developing process.

FIG. 10 is an SEM photograph which shows a section of the anti-reflective layer 56 of the present invention after the developing process has taken place. A silicon substrate and a photoresist pattern are respectively positioned over and under the anti-reflective layer 56. Advantageously, as shown in FIG. 10, the exposed surface of the anti-reflective layer 56 may experience minimal etching.

Figure 11:
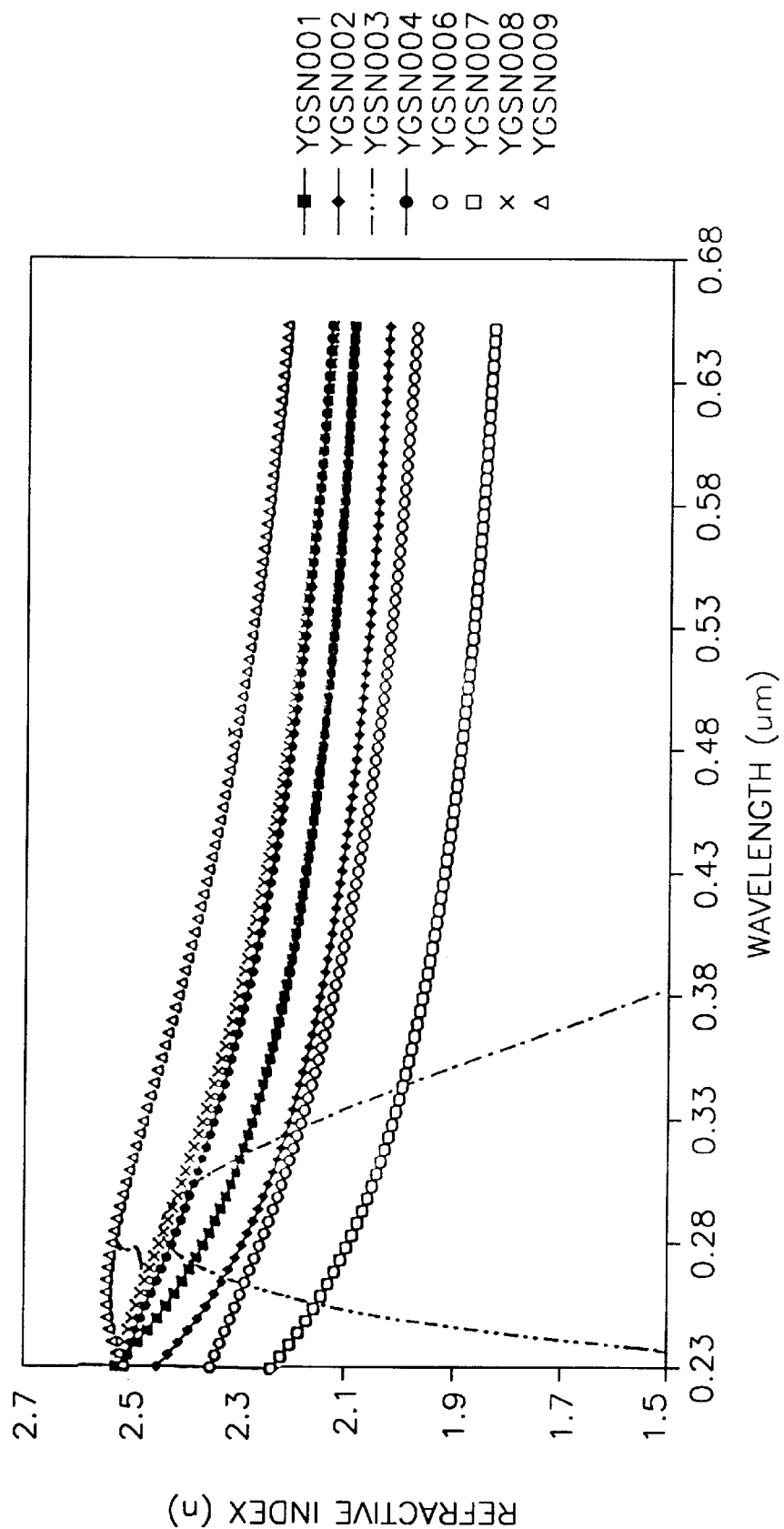
FIG. 11 is a graph illustrating the relationship between an exposure wavelength and a refractive index for an anti-reflective layer.

FIG. 11 illustrates the refractive index n of the anti-reflective layer 56 of the invention with respect to the exposure wavelength. Specifically, refractive index values with respect to the wavelengths of sample anti-reflective layers YGSN0001 to YGSN0009 described in Table 1 are shown. As set forth in FIG. 11, most of the samples with the exception of sample YGSN0003 have similar distributions with respect to wavelength and have a refractive index of greater than 2.0 at 248 nm.

Figure 12:
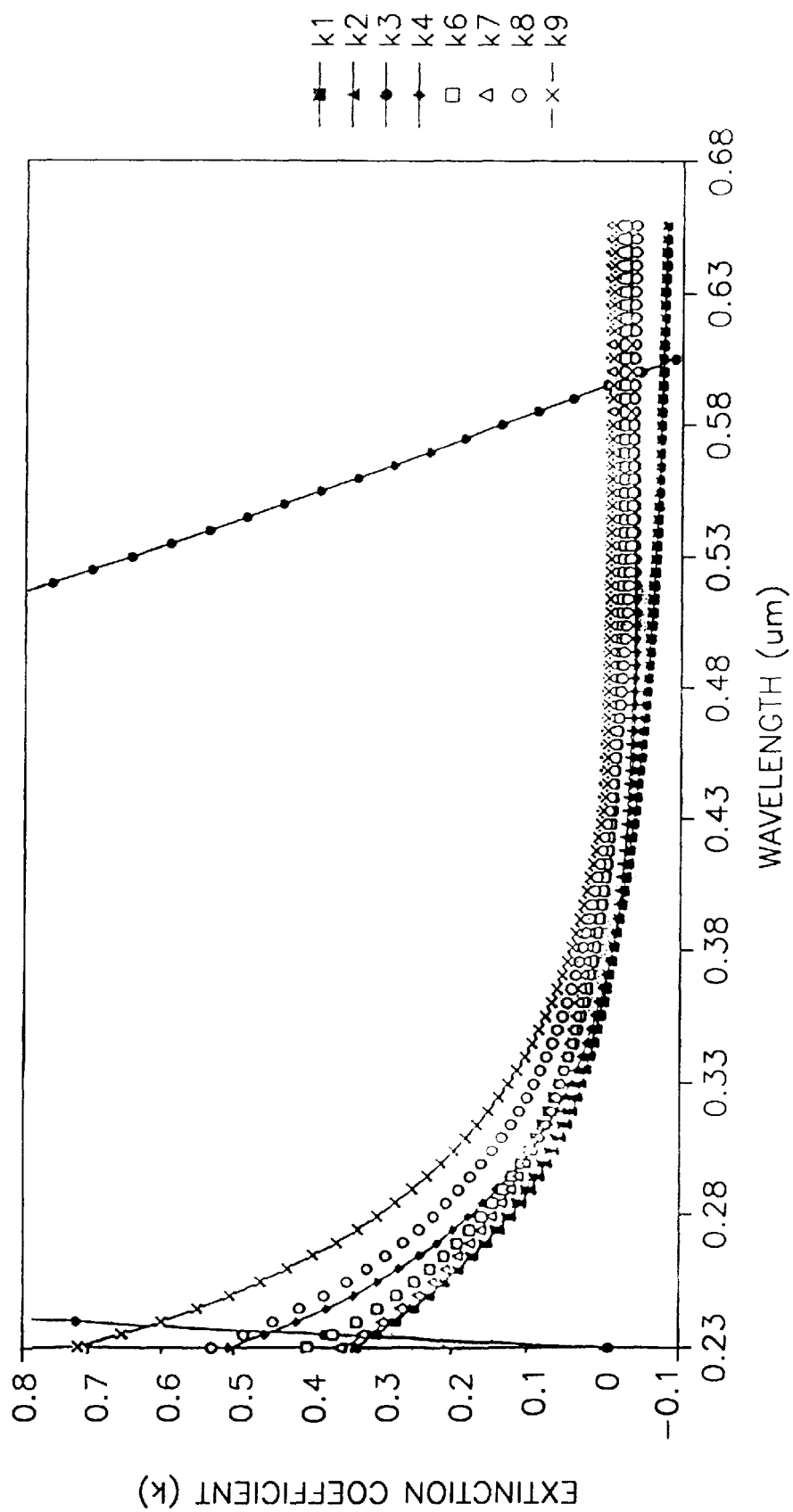
FIG. 12 is a graph illustrating the relationship between the exposure wavelength and the extraction coefficient for an anti-reflective layer.

FIG. 12 shows the extinction coefficients k of various anti-reflective layers 56 of the invention as a function of exposure wavelength. With the exception of sample k3, the extinction coefficients k of all the samples are similar and are greater than 0.25 as determined at 248 nm.

Figure 13:
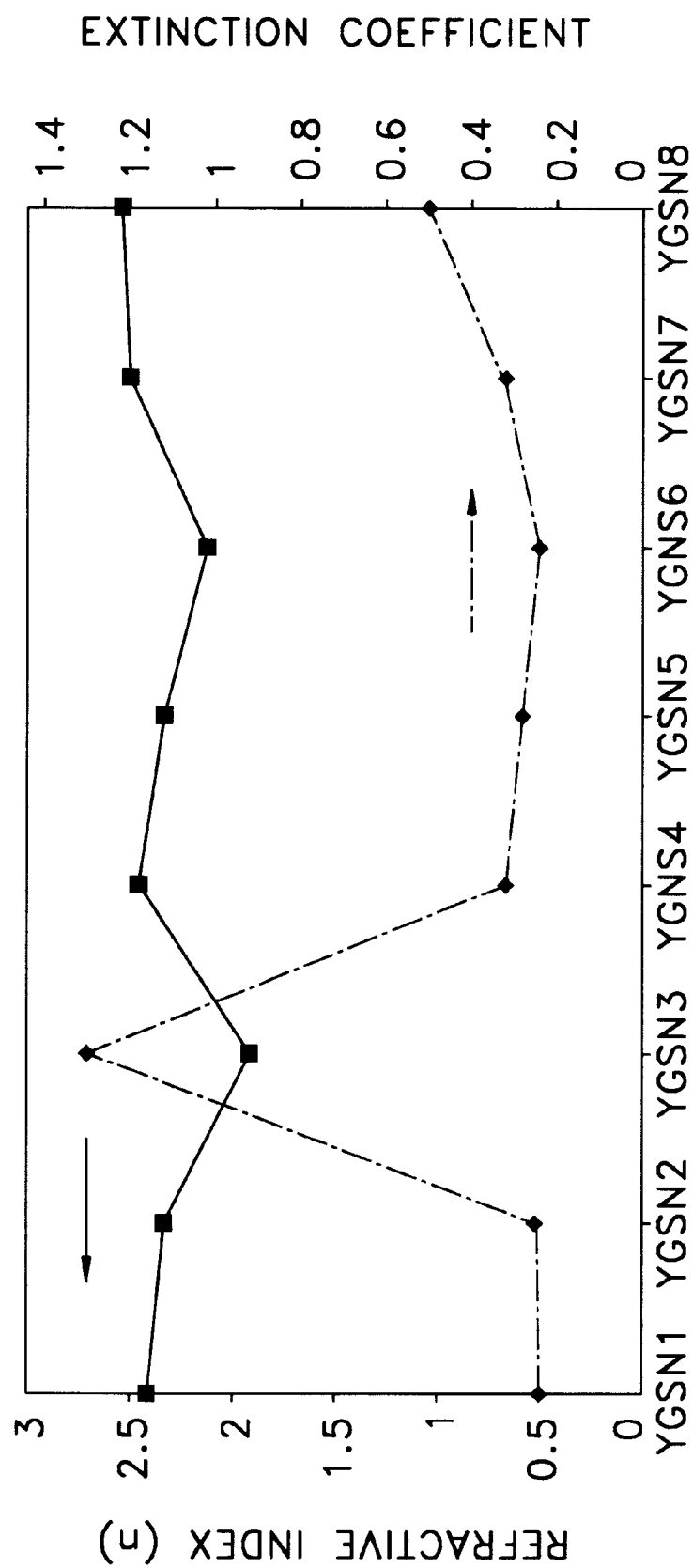
FIG. 13 is a graph illustrating the refractive index and the extraction coefficient according to the exposure wavelengths of anti-reflective layer samples.

FIG. 13 is a graph which shows the refractive index and extraction coefficients of samples listed in Table 1. As set forth, the samples YGSN4, YGSN7, and YGSN8 display potentially desirable values.

The composition of an anti-reflective layer of the invention [(Ge,Si)Nx] and a second germanium-nitrogen anti-reflective layer [GeNx] were analyzed and compared using an XPS (X-Ray Photoelectron Spectroscopy) method. Table 2 lists the atomic percentages of the components contained in the anti-reflective layers.

TABLE 2

|          | Ge   | N    | O    | C    | Si  |
|----------|------|------|------|------|-----|
| GeNx     | 32.9 | 12.7 | 45.8 | 8.6  | 0   |
| (Ge, Si) Nx | 24.3 | 6.5  | 53.6 | 14.8 | 0.8 |

The invention may be desirable for many reasons. For example, when exposing and developing operations are performed using the anti-reflective layers of the invention, it may be possible to produce photoresist patterns in which the line widths are not changed. Moreover, in spite of potential changes in the thicknesses of the photoresist films in step difference portions, notching may not be generated. It is also possible to obtain anti-reflective layers having more uniform thicknesses in the step difference portions in comparison to organic anti-reflective films formed by sputtering methods. The anti-reflective layers can be readily removed using appropriate solutions such as those containing heated mixtures of sulfuric acid and hydrogen peroxide. The anti-reflective layers also may have controllable etching selectivities with respect to other films which are present. The anti-reflective layers may also only be silghtly soluble in water which can be desirable especially during exposing and developing processes in which photoresist patterns are formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An anti-reflective composition used in manufacturing integrated circuit devices, said composition being present in a solid solution, and wherein said composition comprises a silicon-added germanium nitride material.

2. An anti-reflective composition according to claim 1, wherein said composition comprises 0.8 atomic percent of silicon.

3. An anti-reflective composition according to claim 1, wherein said composition further comprises an element selected from the group consisting of oxygen, tin, lead, carbon, hydrogen, fluorine, and mixtures thereof.

4. An anti-reflective composition according to claim 1, wherein the ratio of germanium to silicon ranges from about 0.01 to about 100 based on atomic percentages of the components.

5. An anti-reflective composition according to claim 1, wherein said composition comprises 24.3 atomic percent of germanium, 6.5 atomic percent of nitrogen, 53.6 atomic percent of oxygen, 14.8 atomic percent of carbon, and 0.8 atomic percent of silicon.

6. An anti-reflective composition according to claim 1, wherein said silicon-added germanium nitride material is represented by the formula:

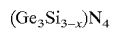

$(Ge_3Si_{3-x})N_4$ wherein x ranges from 0 to 3.

7. An anti-reflective layer used in manufacturing an integrated circuit device, said layer being formed from an anti-reflective composition which is present in a solid solution, and wherein said composition comprises a silicon-added germanium nitride material.

8. An anti-reflective layer according to claim 7, wherein the composition comprises 0.8 atomic percent of silicon.

9. An anti-reflective layer according to claim 7, wherein said anti-reflective composition further comprises an element selected from the group consisting of oxygen, tin, lead, carbon, hydrogen, fluorine, and mixtures thereof.

10. An anti-reflective layer according to claim 7, wherein the ratio of germanium to silicon ranges from about 0.01 to about 100 based on atomic percentages of the components.

11. An anti-reflective layer according to claim 7, wherein said anti-reflective composition comprises 24.3 atomic percent of germanium, 6.5 atomic percent of nitrogen, 53.6 atomic percent of oxygen, 14.8 atomic percent of carbon, and 0.8 atomic percent of silicon.

12. An anti-reflective layer according to claim 7, wherein said silicon-added germanium nitride material is represented by the formula:

$$(Ge_3Si_{3-x})N_4$$

wherein x ranges from 0 to 3.

13. An anti-reflective layer according to claim 7, wherein said layer has a thickness of at least about 5 nm.

14. An anti-reflective layer according to claim 7, wherein said layer has a refractive index of at least about 1.5.

15. An anti-reflective layer according to claim 7, wherein said layer has an extinction coefficient of at least about 0.05 when an exposure wavelength is less than about 450 nm.

16. An integrated circuit device comprising an anti-reflective layer as recited in claim 7 and an underlayer positioned beneath said anti-reflective layer.

17. An integrated circuit device according to claim 16, wherein said underlayer comprises a material selected from the group consisting of tungsten, tungsten silicide, titanium silicide, cobalt silicide, polysilicon, aluminum, aluminum alloy, a polycide comprising a polysilicon and a metal silicide, and mixtures thereof.

* * * * *